(12) United States Patent
Baig et al.

(10) Patent No.: US 7,388,443 B2
(45) Date of Patent: Jun. 17, 2008

(54) APPARATUS AND METHOD FOR WIDE TUNING-RANGE RING OSCILLATORS

(75) Inventors: Mashkoor Baig, Ottawa (CA); Shoujun Wang, Nepean (CA); Haitao Mei, Ottawa (CA); Bill Bereza, Nepean (CA); Tad Kwasniewski, Ottawa (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/410,672

(22) Filed: Apr. 25, 2006

(65) Prior Publication Data

US 2006/0192623 A1    Aug. 31, 2006

Related U.S. Application Data

(63) Continuation of application No. 10/860,440, filed on Jun. 3, 2004, now Pat. No. 7,061,334.

(51) Int. Cl.
*H03B 5/24* (2006.01)
*H03L 7/099* (2006.01)

(52) U.S. Cl. .............. 331/57; 331/25; 331/74; 331/177 R; 331/177 V; 331/179; 331/185

(58) Field of Classification Search .............. 331/1 A, 331/8–11, 16–18, 27, 57, 74, 177 R, 177 V, 331/179, 185, 186
See application file for complete search history.

(56) References Cited

U.S. PATENT DOCUMENTS 5,317,287 A * 5/1994 Brown .................. 331/57

* cited by examiner

*Primary Examiner*—David Mis
(74) *Attorney, Agent, or Firm*—Law Offices of Maximilian R. Peterson

(57) ABSTRACT

An integrated circuit (IC) includes a ring oscillator. One may tune the ring oscillator by controlling a power supply of the ring oscillator. One may further tune ring oscillator by varying a capacitance of at least one varactor. Using the tuning techniques, one may tune the output frequency of the ring oscillator to a desired frequency.

38 Claims, 9 Drawing Sheets

APPARATUS AND METHOD FOR WIDE TUNING-RANGE RING OSCILLATORS

CROSS-REFERENCE TO RELATED APPLICATIONS

This patent application is a continuation application of U.S. patent application Ser. No. 10/860,440, titled "Apparatus and Methods for Wide Tuning-Range Ring Oscillators," filed on Jun. 3, 2004, now U.S. Pat. No. 7,061,334, which is incorporated herein by reference herein.

TECHNICAL FIELD

The inventive concepts relate generally to generating electrical signals, more particularly, to apparatus and methods for generating electrical signals by using wide tuning-range ring oscillators.

BACKGROUND

Modern integrated circuits (ICs) often include complex circuitry that operate on a variety of signals and information. To accommodate the circuit and operational complexity, an IC typically includes one or more clocks signals that facilitate and govern its operation and timing of events. Other applications, such as communications, signal processing, and the like, often use signal sources and generators in addition to clock signals. Circuit designers desire clock generation and signal source circuits that have a relatively wide tuning-range, so as to accommodate a variety of circuits, technologies (under various process, voltage, and temperature variations), and end-user applications.

One may generate clock or reference signals in a variety of ways, including ring oscillators. Typical ring oscillators, however, suffer from certain disadvantages. More specifically, they provide either a relatively wide tuning-range with a relatively high loop gain. Those factors make the ring oscillators susceptible to noise and interference. A need therefore exists for ring oscillators that have relatively wide tuning ranges, but relatively low loop-gains.

SUMMARY

The inventive concepts disclosed here relate to ring oscillators with wide tuning ranges, thus making them suitable for use in a variety of circuits, systems, and end-user applications. In addition, ring oscillators according to the invention have relatively low loop-gains. The low loop-gains tend to limit the susceptibility of the ring oscillators to noise and spurious signals.

One aspect of the invention concerns apparatus for providing time-varying signals. In one exemplary embodiment, an IC includes a ring oscillator. The ring oscillator is configured to be tuned by controlling a power supply of the ring oscillator. The ring oscillator is further configured to be tuned by varying a capacitance of at least one varactor.

In another exemplary embodiment, an IC includes a ring oscillator and two tuning circuits coupled to the ring oscillator. One tuning circuit is configured to tune the output frequency of the ring oscillator by varying the amount of power supplied to the ring oscillator (i.e., power supply control). The other tuning circuit is configured to tune the output frequency of the ring oscillator by varying the capacitance of one or more varactors.

In another exemplary embodiment, a programmable logic device (PLD) includes a signal generator. The signal generator includes a ring oscillator, a variable impedance device, and one or more varactors. The variable impedance device and the varactor(s) couple to the ring oscillator and help to tune its output frequency. The output of the ring oscillator drives one or more desired circuits within the PLD.

In yet another exemplary embodiment, a circuit arrangement includes a phase detector and a ring oscillator. Two tuning mechanisms tune the output frequency of the ring oscillator. More specifically, one tuning circuit controls the amount of power supplied to the ring oscillator. The other tuning circuit varies the capacitance of one or more varactors coupled to the ring oscillator. The phase detector provides an output signal by comparing the phase of an input signal with a phase of a time-varying signal derived from the output signal of the ring oscillator.

Another aspect of the inventive concepts concerns methods of generating time-varying signals. In one exemplary embodiment, a method of generating a signal with a desired frequency includes tuning an output frequency of a ring oscillator to one frequency by controlling an amount of power applied to the ring oscillator. The method further includes tuning the output frequency of the ring oscillator to the desired frequency (or substantially the desired frequency) by varying a capacitance of at least one varactor.

In another exemplary embodiment, a method of providing a set of clock signals in an IC includes coarse-tuning the output frequency of a ring oscillator to a frequency in a range of frequencies that includes a desired clock frequency by controlling a source of power applied to the ring oscillator. The method further includes fine-tuning the output frequency of the ring oscillator to the desired clock frequency by varying a capacitance of at least one varactor.

BRIEF DESCRIPTION OF THE DRAWINGS

The appended drawings illustrate only exemplary embodiments of the invention and therefore should not be considered as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

The inventive concepts contemplate apparatus and associated methods for ring oscillators that feature relatively wide tuning-ranges and relatively low loop-gains. The inventive concepts help to overcome the relatively high loop-gains that plague traditional ring oscillators by degrading their phase noise performance.

Some conventional ring oscillators use power-supply control (also known as current starving) in order to control the frequency of the output signal of the ring oscillator. Power-supply control, however, results in relatively high loop-gains (sometimes known as $K_{VCO}$), which make the ring oscillator prone to noise and spurious signals.

Other conventional oscillators (e.g., inductor-capacitor (LC) oscillators) use varactor tuning (i.e., adjusting the capacitance of a varactor diode so as to modify the frequency of the output signal of the oscillator). Varactor tuning, however, tends to limit the tuning range of the oscillator and, thus, limits its range of application.

In contrast, ring oscillators according to the invention provide relatively wide tuning-ranges, together with relatively low loop-gains. Consequently, they provide increased flexibility and improved performance for a wide variety of applications. More specifically, ring oscillators according to illustrative embodiments of the invention combine power-supply control (or current starving) with varactor tuning in order to provide wider tuning-ranges and lower loop-gains.

The inventive concepts also include tuning ring oscillators according to various embodiments of the invention, i.e., tuning its output frequency or the frequency of its output signal to a desired frequency. More specifically, one coarse-tunes the output frequency of the ring oscillator to a frequency in a range of frequencies that includes the desired frequency. Further, one fine-tunes the output frequency of the ring oscillator to the desired frequency (or to a frequency relatively near or close to the desired frequency).

Figure 1:
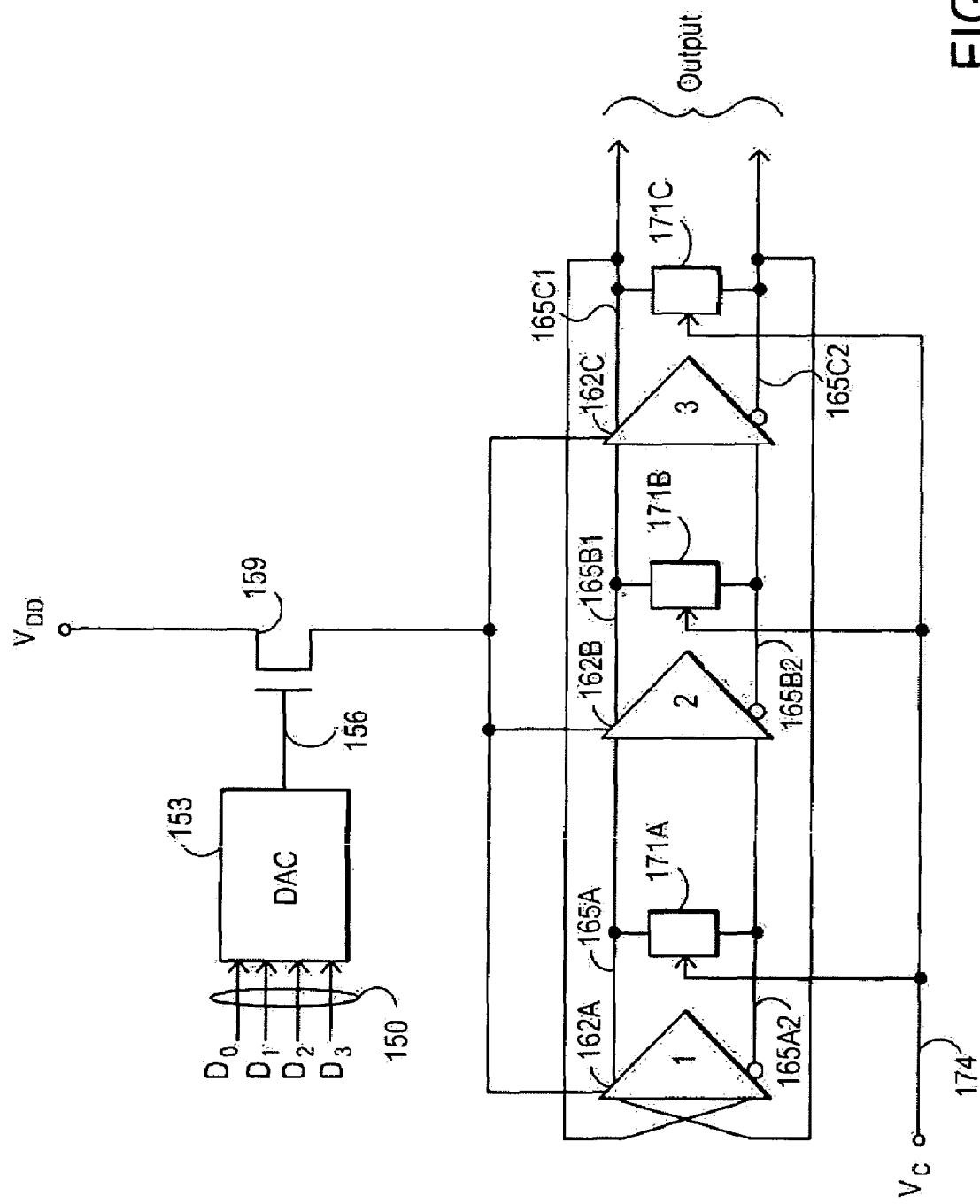
FIG. 1 shows a circuit arrangement according to an exemplary embodiment of the invention that includes ring oscillator.

FIG. 1 shows a circuit arrangement according to an exemplary embodiment of the invention that includes ring oscillator. The circuit arrangement includes inverting stages 162A-162C, varactors 171A-171C, digital-to-analog converter (DAC) 153, and transistor (or, generally, adjustable impedance) 159.

Inverting stages 162A-162C may constitute inverting amplifiers (i.e., amplifiers in which the phase of the output signal is the inverse or negative of the phase of the input signal). Alternatively, inverting stages 162A-162C may constitute inverters or buffers with appropriate phase adjustment of the output signal in forming the ring oscillator.

In the embodiment in FIG. 1, inverting stages 162A-162C have differential outputs (i.e., output signals 165A1-165A2, 165B1-165B2, and 165C1-165C2, respectively). More specifically, output signals 165A1-165A2 constitute the differential output signal of inverting stage 162A. Similarly, output signals 165B1-165B2 constitute the differential output signal of inverting stage 162B. Likewise, output signals 165C1-165C2 constitute the differential output signal of inverting stage 162C.

Each of inverting stages 162A-162C also has a differential input. The differential input of each stage couples to the differential output of the preceding stage. For example, the differential input of inverting stage 162B couples to the differential output of inverting stage 162A. The differential outputs and the differential inputs provide increased noise immunity, hence improved performance of the ring oscillator.

Inverting amplifiers 162A-162C form a basic ring oscillator structure. More specifically, output signals 165A1-165A2 (i.e., the differential output signal) of inverting stage 162A couple to the respective differential input of inverting stage 162B. Similarly, output signals 165B1-165B2 (i.e., the differential output signal) of inverting stage 162B couple to the respective differential input of inverting stage 162C.

Inverting stage 162C couples to inverting stage 162A so as to form a ring (hence the nomenclature "ring oscillator"). In particular, output signals 165C1-165C2 (i.e., the differential output signal) of inverting stage 162C couple to the respective differential input of inverting stage 162A. The basic ring oscillator (i.e., the cascade or ring coupling of inverting stages 162A-162C) operates in a manner well known to persons of ordinary skill in the art.

DAC 153 and transistor 159 provide a mechanism for coarse tuning of the frequency of the output signal of the ring oscillator through power-supply control. Put another way, DAC 153 provides an analog control signal 156 that controls the conduction of current through transistor 159 (generally, a variable or controllable impedance device or a variable or controllable current-conduction device, such as a metal oxide semiconductor field-effect transistor, or MOSFET).

The amount of current that transistor 159 conducts affects the amount of current or power supplied to the ring oscillator structure (inverting stages 162A-162C). The current or power supplied to the ring oscillator influences its speed of oscillation. In other words, the more current available, the faster the devices within the ring oscillator can switch, and the faster they can charge and discharge parasitic elements (e.g., capacitances, etc.). As a result, increased amounts of current result in higher frequency of oscillation of the ring oscillator.

Conversely, the less the amount of current available, the slower the speed of switching of the devices within the ring oscillator, and the less current available for charging and discharging of parasitic elements. Thus, decreased current amounts result in lower frequency of oscillation of the ring oscillator. In sum, one may control the frequency of oscillation by controlling the amount of current or power available to the ring oscillator structure (i.e., by controlling transistor 159).

DAC 153 receives a set of digital control signals 150, designated as signals $D_0$ through $D_4$. Control signals 150 constitute coarse-tuning control signals. Put another way, control signals 150 provide a digital word to DAC 153, which it converts to analog control signal 156. Analog control signal 156 in turn influences the amount of current or power that transistor 159 provides to the ring oscillator structure and, hence, its frequency of oscillation.

One may implement DAC 153 in a variety of ways, as persons of ordinary skill in the art who have the benefit of the description of the invention understand. As one example, one may use a plurality of transistors, such as MOSFETs, coupled in parallel. Each bit of digital control signals 150 drives a corresponding one of the transistors. In such an implementation, the number of transistors corresponds to the number of bits in control signals 150.

Varactors 171A-171C provide a mechanism for fine tuning of the frequency of the output signal of the ring oscillator. More specifically, each of varactors 171A-171C presents a capacitance to a respective one of inverting stages 162A-162C. By varying an analog control signal 174 (labeled as "$V_c$"), one may vary the capacitance of varactors 171A-171C and, hence, the frequency of oscillation of the ring oscillator. Note that one may use a variety of varactors, such as diode PN-junction varactors, p-type MOS (PMOS) varactors, n-type MOS (NMOS) varactors, and the like, as persons of ordinary skill in the art with the benefit of the description of the invention understand.

Suppose that one applies control signal 174 so as to cause the capacitance of varactors 171A-171C to increase. Because of the increased capacitance, it will take longer for inverting stages 162A-162C to charge and discharge. Consequently, the frequency of output signal (i.e., signals 165C1 and 165C2) will decrease.

Conversely, suppose that one applies control signal 174 so as to cause the capacitance of varactors 171A-171C to decrease. The decreased capacitance will take less time for inverting stages 162A-162C to charge and discharge. As a result, the frequency of output signal (i.e., signals 165C1 and 165C2) will increase. Thus, by applying various levels of control signal 174, one may fine-tune the frequency of the output signal of the ring oscillator.

By combining the power-supply control and varactor-tuning techniques, one may accomplish coarse tuning and fine tuning of the frequency of oscillation of the ring oscillator. In other words, one applies an appropriate set of digital control signals 150 to coarse-tune the ring oscillator. More specifically, one chooses digital control signals 150 so that the ring oscillator will oscillate at a frequency that is relatively near the desired output frequency. One may then apply an appropriate control signal 174 so as to cause the frequency of oscillation of the ring oscillator to equal the desired output frequency (or fall within a relatively tight band of frequencies around the desired output frequency).

Figure 2:
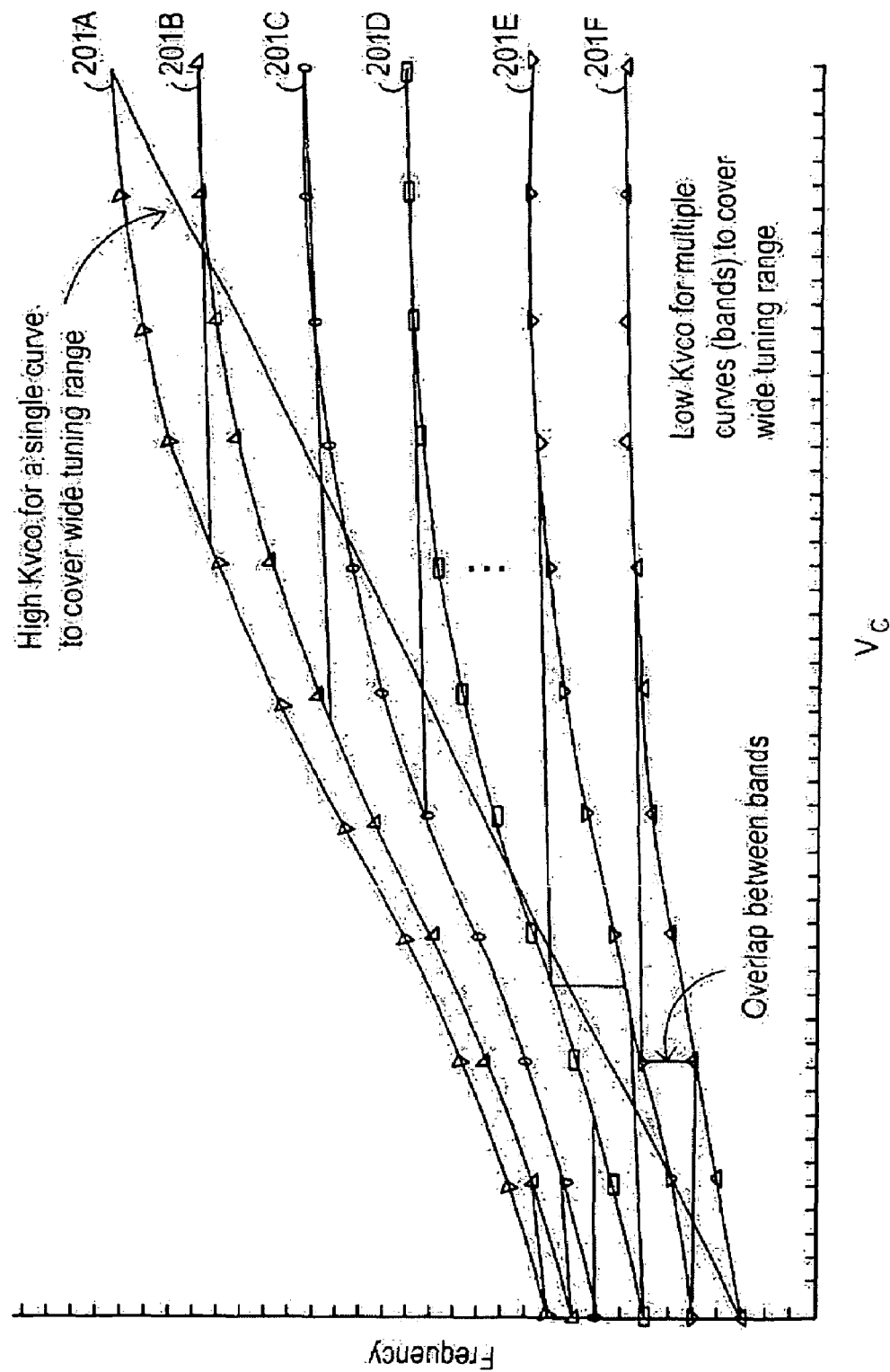
FIG. 2 illustrates a set of tuning curves for a ring oscillator according to an exemplary embodiment of the invention.

FIG. 2 shows a set of tuning curves for a ring oscillator according to an exemplary embodiment of the invention. In particular, the tuning curves correspond to the ring oscillator shown in FIG. 1.

Each of tuning curves 201A-201F corresponding to a set of values that digital control signals 150 represent. For example, curve 201A may correspond to $D_0=1, D_1=1, D_2=1,$ and $D_3=1$, whereas curve 201F may correspond to $D_0=0, D_1=0, D_2=0,$ and $D_3=0$. Thus, tuning curves 201A-201F represent the coarse tuning of the ring oscillator by applying various values of digital control signals 150.

For each tuning curve (i.e., a given set of digital control signals 150), one may vary control signal 174 to sweep or fine tune the output frequency of the ring oscillator. Generally, the range of the values of the control signal may span the power supply voltage(s) (i.e., a rail-to-rail voltage). The tuning curves in FIG. 2 cover a relatively large frequency range, without causing excessive sensitivity (Kvco) in the oscillator to the control voltage (Vc).

Note that the embodiment shown in FIG. 1 represents merely one possible embodiment of a ring oscillator according to the inventive concepts. As persons of ordinary skill in the art with the benefit of the description of the invention understand, the inventive concepts lend themselves to a variety of other embodiments. FIGS. 3-6 illustrate some of those embodiments merely for purposes of illustration.

Figure 3:
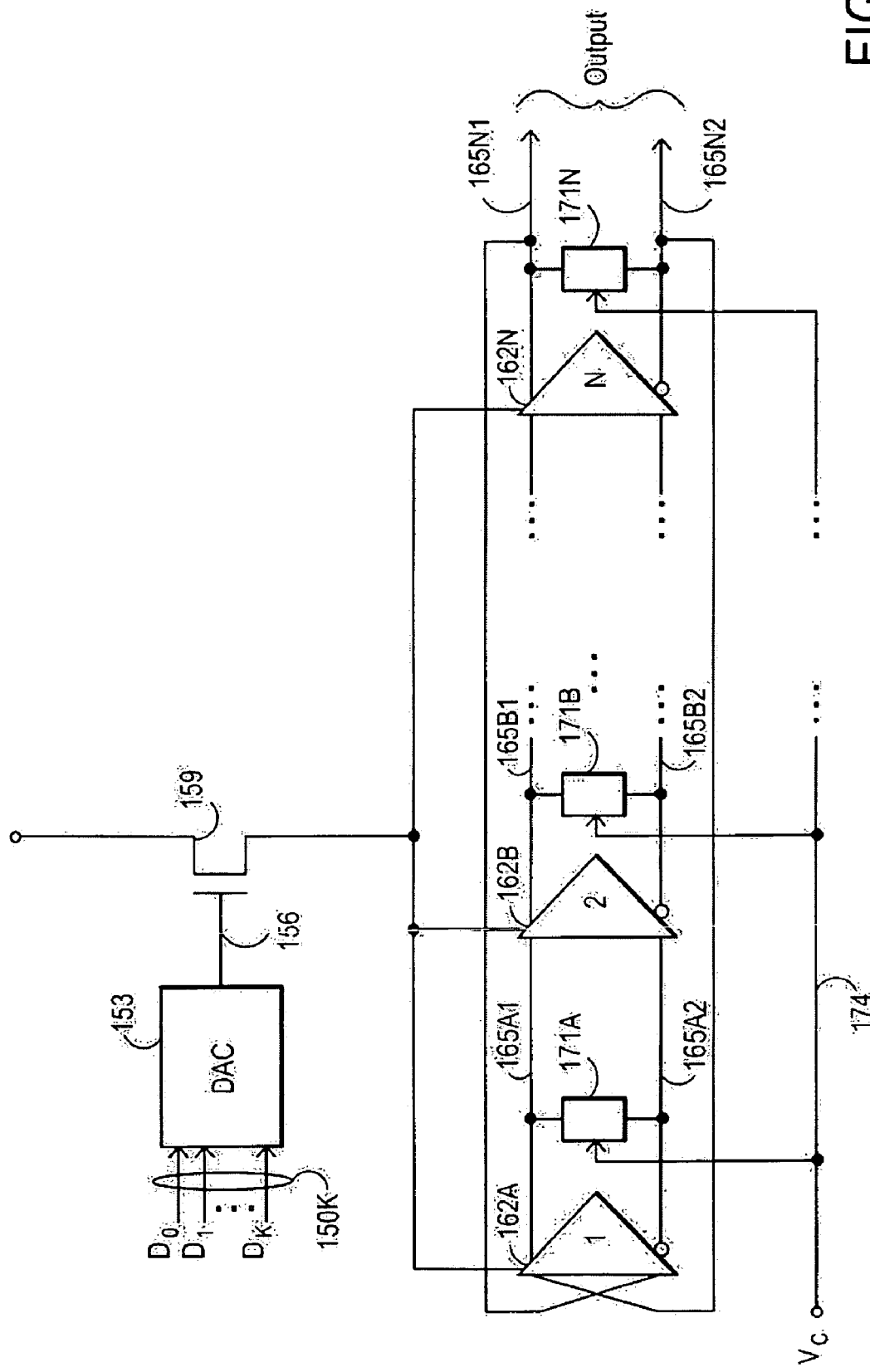
FIG. 3 illustrates another exemplary embodiment of a circuit arrangement according to the invention that includes a ring oscillator.

FIG. 3 shows a second exemplary embodiment of a circuit arrangement according to the invention that includes a ring oscillator. The circuit arrangement includes inverting stages 162A-162N, varactors 171A-171N, DAC 153, and transistor (or, generally, variable impedance device, such as a MOS-FET) 159.

Generally, the ring oscillator in FIG. 3 has a similar structure to the ring oscillator in FIG. 1 and operates in a like manner. In contrast to the ring oscillator in FIG. 1, however, the ring oscillator in FIG. 3 has an arbitrary number (N) of inverting stages 162A-165N, together with a corresponding number of varactors 171A-171N. The number N denotes a positive integer (typically greater than or equal to two). In particular, note that a value of N=3 (i.e., three inverting stages and three corresponding varactors) results in the ring oscillator shown in FIG. 1.

Different values of N result in ring oscillators with varying characteristics. For example, a relatively large value of N results in a ring oscillator that tends to have lower frequencies of oscillation, and vice-versa. Thus, one may select the number of inverting stages, N, depending on the design and performance specifications for a given application, as persons of ordinary skill in the art who have the benefit of the description of the invention understand.

Furthermore, the circuit arrangement in FIG. 3 uses an arbitrary or desired number (K) of digital control signals 150K. More particularly, digital control signals 150K include K bits of digital information, i.e., $D_0, D_1, \ldots, D_K$, where K denotes a positive integer greater than one. Put another way, DAC 153 has an arbitrary resolution, which depends on the number K. By selecting a value of K, one may implement a DAC that has a desired resolution. In particular, note that a value of K=3 (i.e., four bits of digital information) results in the DAC shown in FIG. 1.

Generally, the higher the value of K, the more resolution DAC 153 has, and vice-versa. One may select the number K depending on the design and performance specifications for a given application, as persons of ordinary skill in the art who have the benefit of the description of the invention understand.

Figure 4:
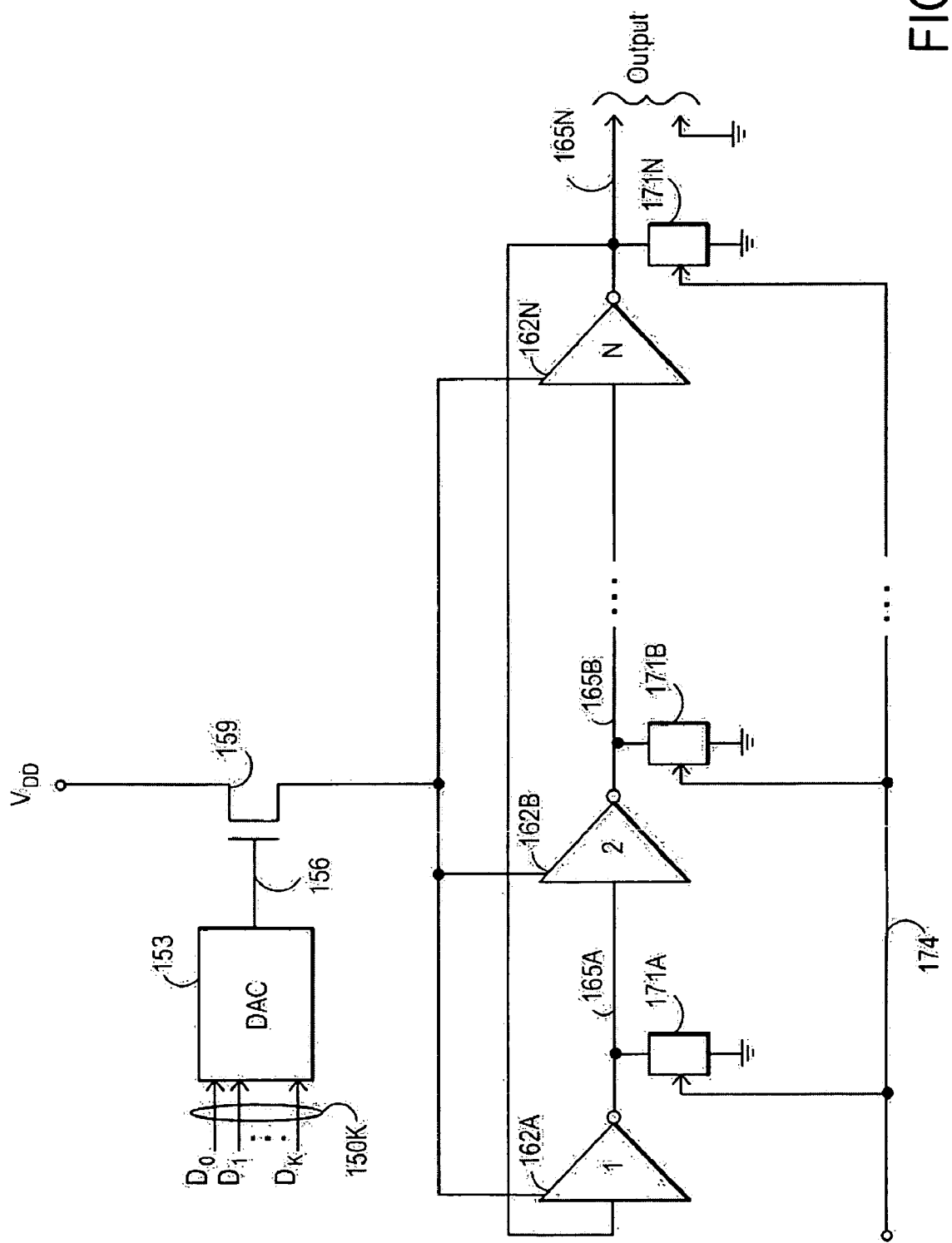
FIG. 4 depicts another illustrative embodiment of a circuit arrangement according to the invention that includes a ring oscillator.

FIG. 4 shows another exemplary embodiment of a circuit arrangement according to the invention that includes a ring oscillator. The circuit arrangement includes inverting stages 162A-162N, varactors 171A-171N, DAC 153, and transistor (or generally, variable impedance device, such as a MOS-FET) 159.

Generally, the ring oscillator in FIG. 4 has a similar structure to the ring oscillator in FIG. 1 and operates in a like manner. In contrast to the ring oscillator in FIG. 1, however, the ring oscillator in FIG. 4 uses inverting stages 162A-162N that have single-ended, rather than differential, inputs and outputs.

More specifically, each of inverting stages 162A-162N provides a respective single-ended output signal 165A-165N. Similar to FIG. 1, inverting stages 162A-162N couple in a ring structure (i.e., output of inverting stage 162A feeds input of inverting stage 162B, and so on, with output of inverting stage 162N feeding input of inverting stage 162A. In addition, rather than coupling between the two differential output lines of each of inverting stages 162A-162N in FIG. 1, varactors 171A-171N couple between a respective single-ended output of one of inverting stages 162A-162N and circuit ground. As noted above, one may use a variety of varactors, such as diode PN-junction varactors, p-type MOS (PMOS) varactors, n-type MOS (NMOS) varactors, and the like, as persons of ordinary skill in the art with the benefit of the description of the invention understand. Furthermore, one may implement the varactors as differential or single-ended, depending on the desired architecture of the ring oscillator.

Using inverting stages 162A-162N with single-ended inputs and outputs results in simpler circuitry that tends to consume less power than its differential counterpart. On the other hand, using single-ended circuitry tends to result in higher susceptibility to noise or spurious signals.

Similar to the circuit arrangement in FIG. 3, the embodiment in FIG. 4 includes an arbitrary number (N) of inverting stages 162A-165N, together with a corresponding number of varactors 171A-171N. The number N denotes a positive odd integer. Different values of N result in the characteristics described above in connection with FIG. 3.

Also similar to FIG. 3, the circuit arrangement in FIG. 4 uses an arbitrary number (K) of digital control signals 150K, where K denotes a positive integer greater than one. By selecting a value of K, one may implement a DAC that has a desired resolution. The various values of K result in the characteristics described above in connection with FIG. 3.

Figure 5:
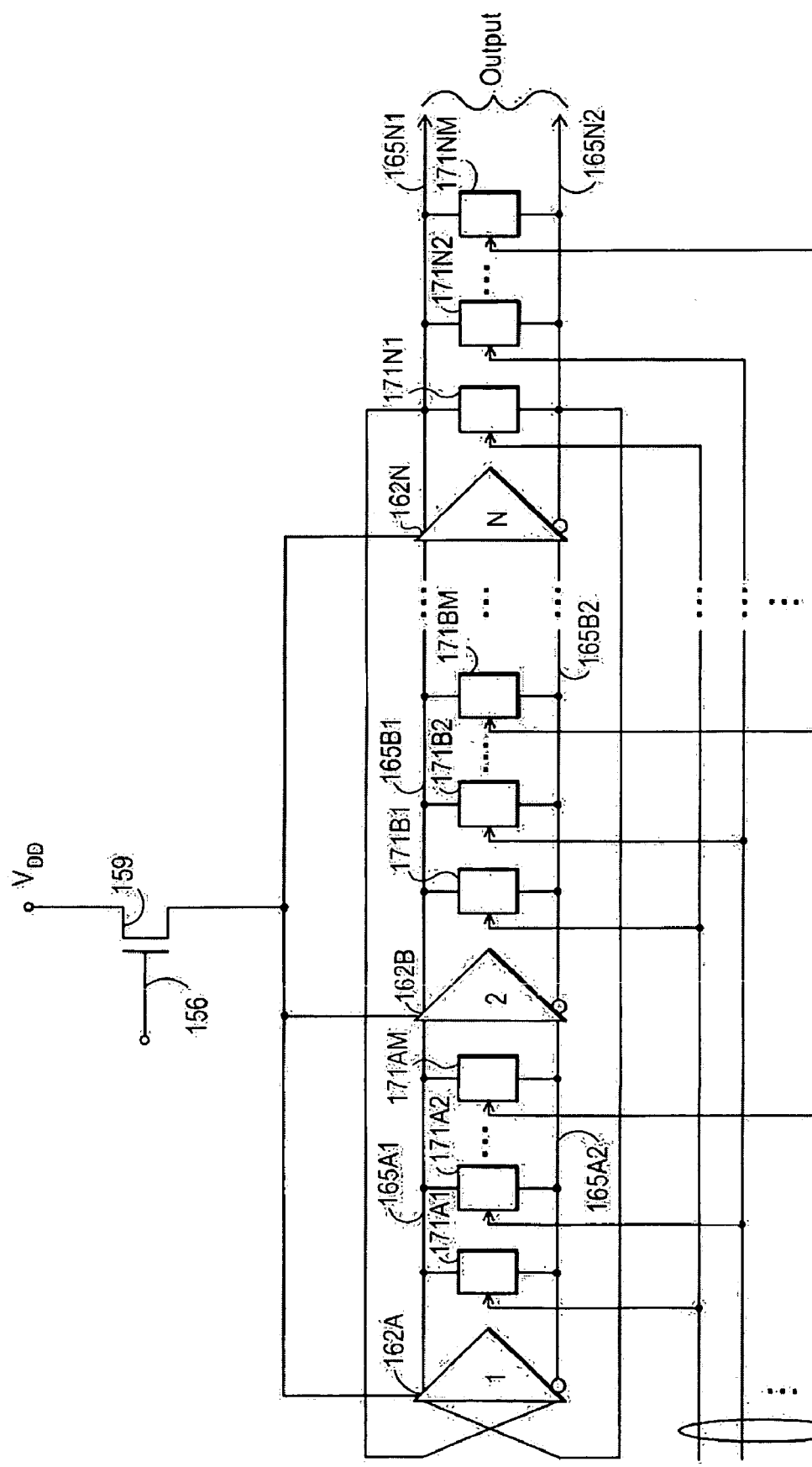
FIG. 5 shows yet another embodiment of a circuit arrangement according to the invention that includes a ring oscillator.

FIG. 5 shows another illustrative embodiment of a circuit arrangement according to the invention that includes a ring oscillator. The circuit arrangement includes inverting stages 162A-162N, varactors 171A1-17NM, and transistor (or generally, variable impedance device, such as a MOSFET) 159. Inverting stages 162A-162N have differential inputs and outputs, and couple in a ring formation to realize a ring oscillator structure.

Similar to the circuit arrangement in FIGS. 3 and 4, the embodiment in FIG. 5 includes an arbitrary number (N) of inverting stages 162A-165N, together with a corresponding number of varactors 171A1-171NM. The number N denotes a positive odd integer greater than or equal to three (N≧3). Different values of N result in the characteristics described above.

Note that, rather than using transistor 159 together with a DAC, the embodiment in FIG. 5 omits the DAC. In other words, instead of using transistor 159 to coarse-tune the frequency of the output signal of the ring oscillator, the circuit arrangement in FIG. 5 uses transistor 159 to fine-tune the output frequency of the ring oscillator.

Furthermore, the embodiment in FIG. 5 uses a bank of varactors 171A1-171NM to coarse-tune the frequency of the output signal of the ring oscillator. More specifically, the output of each of inverting stages 162A-162N couples to a set of M varactors. The number M constitutes a positive integer and denotes the number of varactors corresponding to each of inverting stages 162A-162N.

For example, the output signals 165A1 and 165A2 of inverting stage 162A couple to varactors 171A1-171AM. Similarly, the output signal lines 165B1 and 165B2 of inverting stage 162B couple to varactors 171B1-171BM, and so on. Finally, the output signal lines output signals 165N1 and 165N2 of inverting stage 162A couple to varactors 171N1-171NM.

A set of control signals 174M couple to varactors 171A1-171NM. More specifically, each of the signals in the set of control signals 174M couples to, and controls, a corresponding varactor in a set of varactors coupled to each of inverting stages 162A-162N. For example, the first signal in signals 174M couples to, and controls, varactor 171A1, the second signal couples to, and controls, varactor 171A2, and so on.

The capacitance values of the varactors in each set of varactors corresponding to one of inverting stages 162A-162N may have a desired or specific relationship. For example, one may use a binary weighting for the values of varactor capacitances (in other words, the capacitance values may vary as powers of two). As persons of ordinary skill in the art who have the benefit of the description of the invention understand, depending on factors such as design and performance specifications for a particular application, one may use capacitance weightings and values, as desired.

Figure 6:
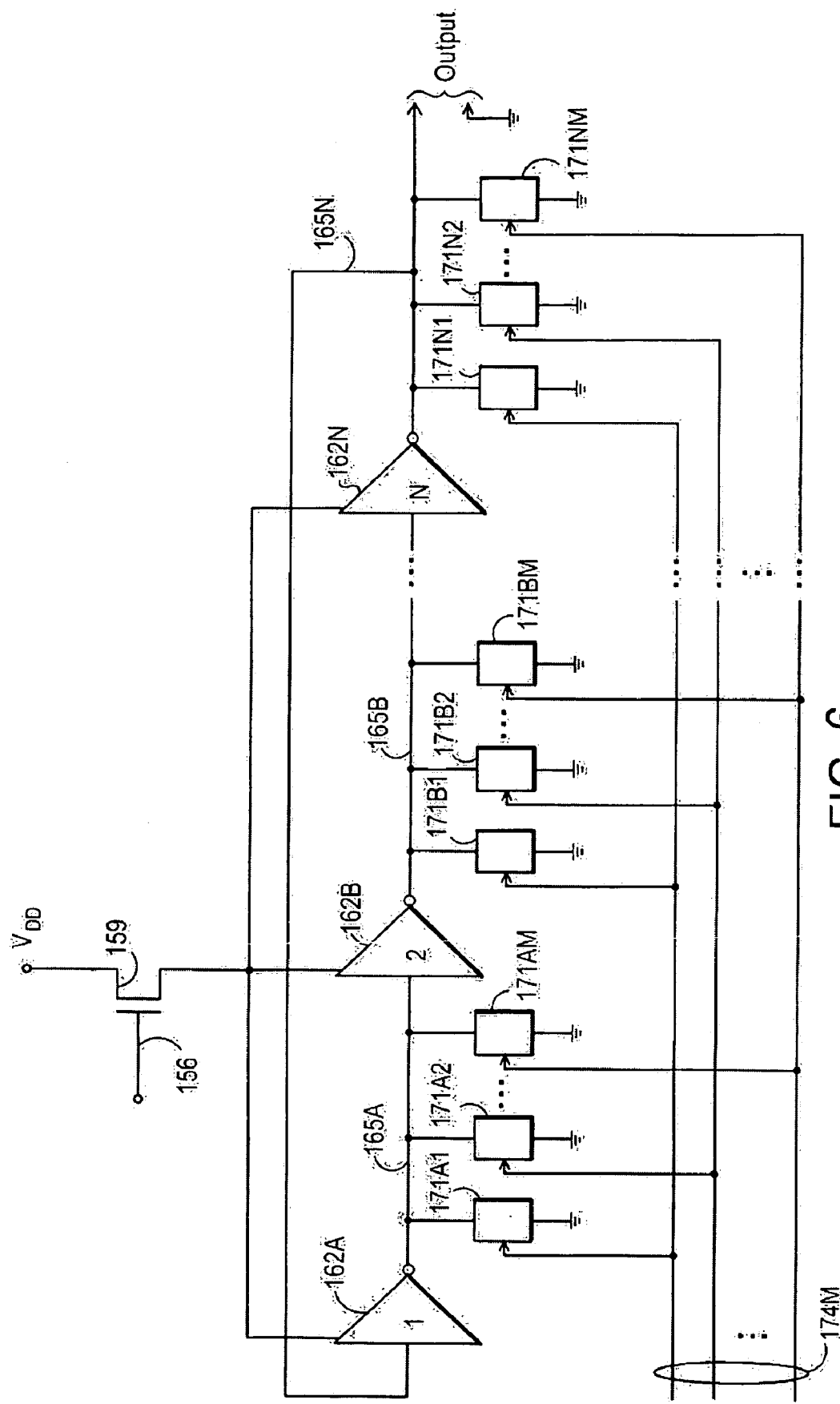
FIG. 6 illustrates an exemplary embodiment according to the invention of a phase-locked loop (PLL).

FIG. 6 shows yet another embodiment of a circuit arrangement according to the invention that includes a ring oscillator. The circuit arrangement in FIG. 6 includes inverting stages 162A-162N, varactors 171A1-17NM, and transistor (or generally, variable impedance device, such as a MOSFET) 159. Inverting stages 162A-162N couple in a ring formation to realize a ring oscillator structure.

Similar to the circuit arrangement in FIGS. 3-5, the embodiment in FIG. 6 includes an arbitrary number (N) of inverting stages 162A-165N, together with a corresponding number of varactors 171A1-171NM. The number N denotes a positive odd integer. Different values of N result in the characteristics described above.

Similar to the embodiment in FIG. 5, the circuit arrangement in FIG. 6 uses transistor 159 to fine-tune the frequency of the output signal of the ring oscillator. In addition, the embodiment in FIG. 6 uses the bank of varactors 171A1-171NM to coarse-tune the frequency of the output signal of the ring oscillator.

Generally, the ring oscillator in FIG. 6 has a similar structure to the ring oscillator in FIG. 5 and operates in a like manner. In contrast to the ring oscillator in FIG. 5, however, the ring oscillator in FIG. 6 uses inverting stages 162A-162N that have single-ended, rather than differential, inputs and outputs.

More specifically, each of inverting stages 162A-162N in FIG. 6 provides a respective single-ended output signal 165A-165N. Similar to FIG. 5, inverting stages 162A-162N couple in a ring structure (i.e., output of inverting stage 162A feeds input of inverting stage 162B, and so on, with output of inverting stage 162N feeding input of inverting stage 162A. In addition, rather than coupling between the two differential output lines of each of inverting stages 162A-162N in FIG. 5, varactors 171A1-171NM couple between a respective single-ended output of one of inverting stages 162A-162N and circuit ground.

Using inverting stages 162A-162N with single-ended inputs and outputs results in the characteristics and tradeoffs described above. In other words, single-ended inverting stages 162A-162N result in simpler circuitry that tends to consume less power than its differential counterpart. On the other hand, using single-ended circuitry tends to result in higher susceptibility to noise or spurious signals.

Figure 7:
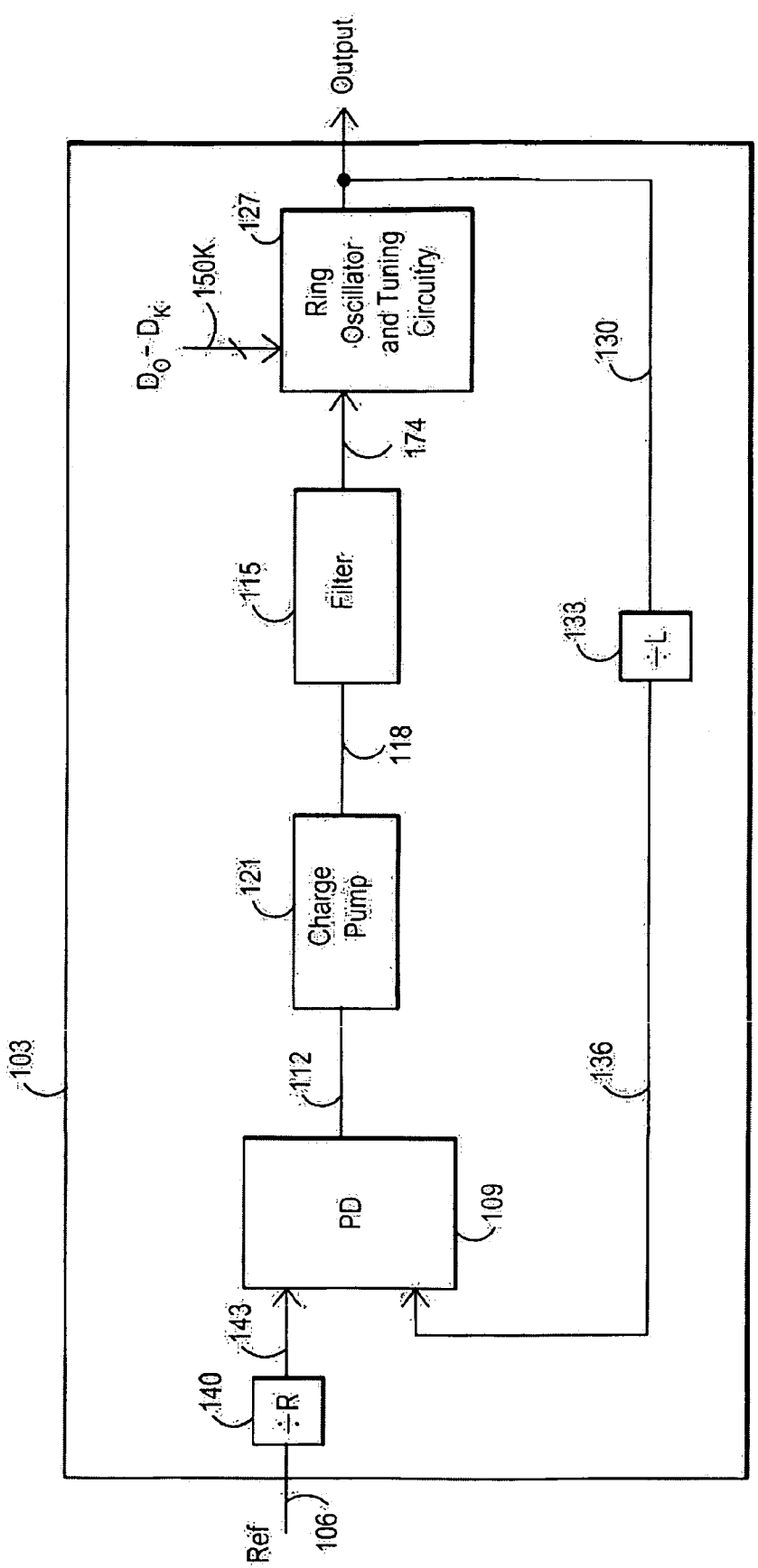
FIG. 7 depicts an exemplary embodiment of an integrated circuit (IC) that includes circuit arrangements according to the invention.

One may use the circuit arrangements in FIGS. 1-6 above to implement PLLs. FIG. 7 illustrates an exemplary embodiment according to the invention of a PLL. The PLL includes divider 140, phase detector 109, filter 115, charge pump 121, ring oscillator and tuning circuitry 127, and divider 133.

Generally, the PLL in FIG. 7 has a structure similar to conventional PLLs and operates in a similar manner. In contrast to conventional PLLs, however, the PLL in FIG. 7 uses ring oscillators and coarse-tuning and fine-tuning circuitry according to the invention (e.g., the circuit arrangements shown in FIGS. 1-6).

Divider 140 accepts a reference signal 106, and divides its frequency by R to provide signal 143 to phase detector 143. Similarly, divider 133 accepts output signal 130 of the PLL, and divides its frequency by L to provide signal 136 to phase detector 109. Phase detector 109 compares the respective phases of signal 143 and signal 136 to generate a phase error signal 112.

Charge pump 121 uses phase error signal 112 to generate control signal 118. Filter 115 filters control signal 118 to generate control signal 174. Control signal 174 constitutes the fine-tuning signal for ring oscillator and tuning circuitry 127. Ring oscillator and tuning circuitry 127 also receives discrete control signals 150K. Ring oscillator and tuning circuitry 127 generate output signal 130 of the PLL.

The number and configuration of control signals 150K depends on various factors that fall within the knowledge of persons of ordinary skill in the art who have the benefit of the description of the invention. Such factors include which circuit arrangement one uses (e.g., which of the circuit arrangements in FIGS. 1-6), the design and performance specifications for a given implementation, and the like. Generally, one may use a clock reference to calibrate or determine the coarse output frequency. One may use, for example, a look-up table implemented within a PLD (see FIGS. 8-9) for the coarse tuning.

In steady-state operation, the frequency of output signal 130 ($f_{out}$) and the frequency of reference signal 106 ($f_{ref}$) have the following relationship:

$$f_{out}/L = f_{ref}/R$$

or, stated differently, $$f_{out} = (L/R)f_{ref}$$

Note that, by using various values of R and L, one may produce output signals 130 whose frequency ($f_{out}$) is higher or lower than the frequency ($f_{ref}$) of reference signal 106, as desired. More specifically, if (L/R)>1, then $f_{out}>f_{ref}$, whereas if (L/R)<1, then $f_{out}<f_{ref}$. (Note that, for the special case where (L/R) equals unity, then $f_{out}=f_{ref}$.)

Figure 8:
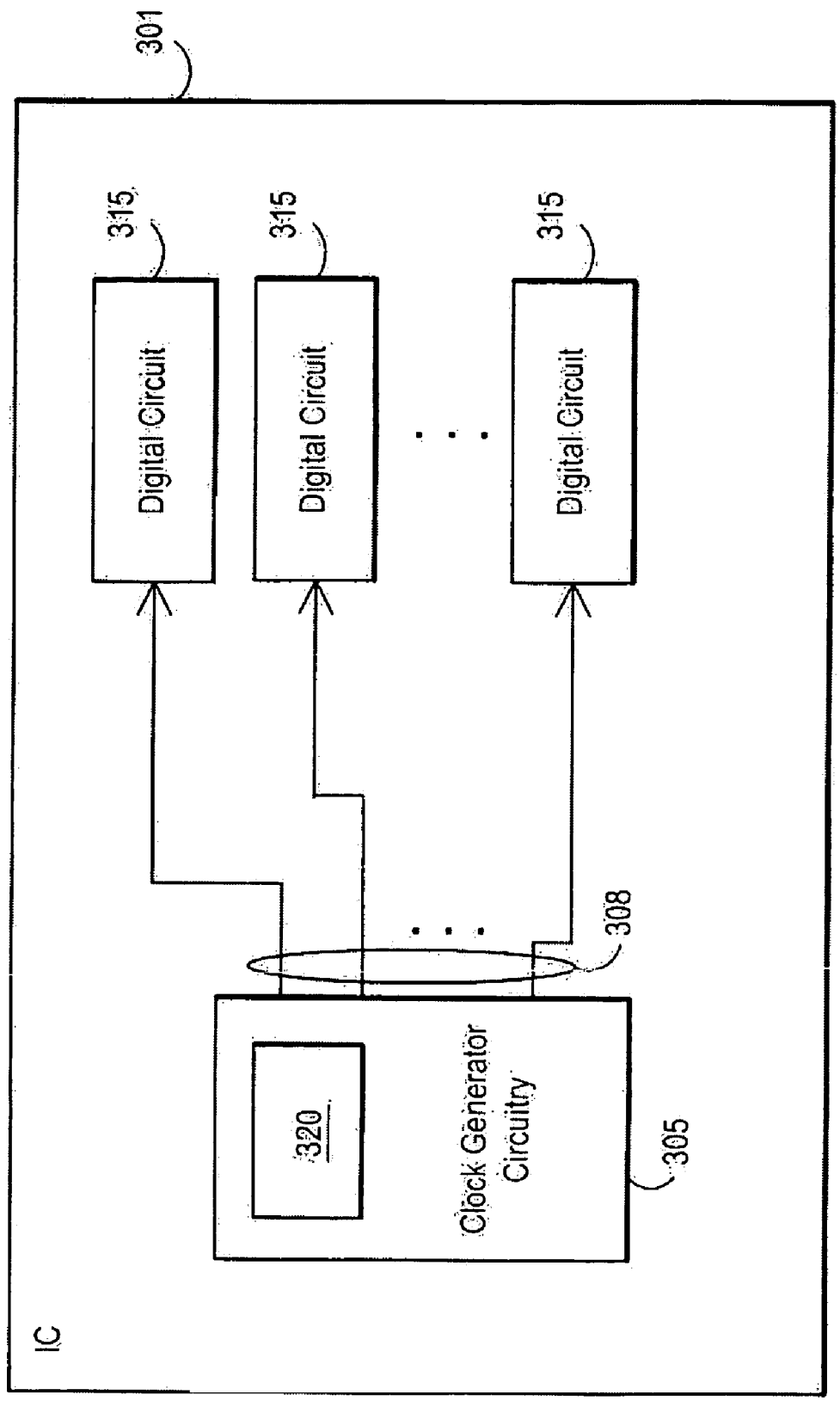
FIG. 8 shows an exemplary embodiment of a programmable logic device (PLD) that includes one or more circuit arrangements according to the invention.
Figure 9:
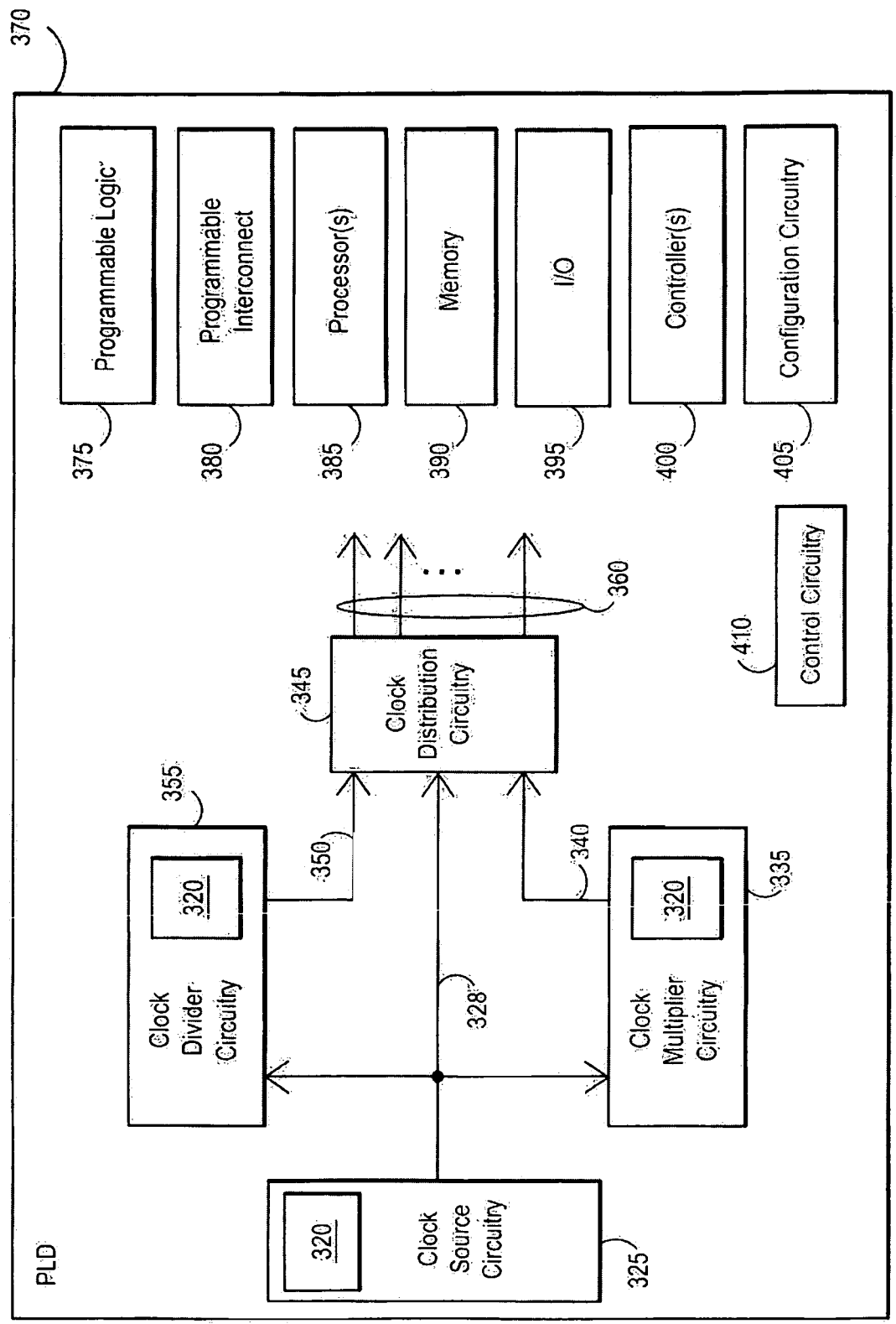
FIG. 9 shows an exemplary embodiment of a PLD that includes one or more circuit arrangements according to the invention.

One may use the inventive concepts in a variety of applications, as persons of ordinary skill in the art who have the benefit of the description of the invention understand. FIGS. 8 and 9 provide two illustrative applications.

FIG. 8 shows an exemplary embodiment of an integrated circuit (IC) 301 that includes circuit arrangements according to the invention. IC 301 includes clock generation circuitry 305, and one or more digital circuits 315. Digital circuits 315 may include a wide variety of circuitry, such as processors, memory, controllers, input/output (I/O), test circuitry, communication circuitry, and the like, as persons of ordinary skill in the art with the benefit of the description of the invention understand.

Clock generation circuitry 305 may include one or more signal sources 320. Each of signal sources 320 may constitute a circuit arrangement as shown in FIGS. 1 and 3-7. More specifically, each signal source 320 may include a ring oscillator and associated tuning circuitry according to FIGS. 1 and 3-6. In addition, or instead, each signal source 320 may include a PLL, such as the PLL in FIG. 7.

Using signal source(s) 320, clock generation circuitry 305 generates one or more clock signals 308. Clock signal(s) 308 drive a respective one of digital circuit(s) 315. Note that, instead, or in addition, one of clock signal(s) 308 may drive more than one digital circuit 315, as desired.

FIG. 9 shows an exemplary embodiment of a PLD 370 that includes one or more circuit arrangements according to the invention. PLD 370 includes clock source circuitry 325, clock distribution circuitry 345, programmable logic 375, programmable interconnect 380, I/O circuitry 395, configuration circuitry 405, and control circuitry 410.

In addition, PLD 370 may include one or more processors 385, memory circuitry 390, one or more controllers 400, clock divider circuitry 355, and clock multiplier circuitry 385, as desired. Clock distribution circuitry 345 provides one or more clock signals 360 to various blocks and circuits within PLD 370, such as one or more of programmable logic 375, programmable interconnect 380, processor(s) 385, memory or memories 390, I/O circuitry 395, controller(s) 400, configuration circuitry 405, and control circuitry 410.

Note that FIG. 9 shows a simplified block diagram of a PLD. Thus, PLD 370 may include other blocks and circuitry, as persons of ordinary skill in the art understand. Examples of such circuitry include test/debug circuitry, communication circuitry, redundancy circuits, and the like, as desired.

Programmable logic 375 includes blocks of configurable or programmable logic circuitry, such as look-up tables (LUTs), product-term logic, multiplexers, logic gates, registers, memory, and the like. Programmable interconnect 380 couples to programmable logic 375 and provides configurable interconnects (coupling and routing mechanisms) between various blocks within programmable logic 375 and other circuitry within or outside PLD 370.

Control circuitry 410 controls various operations within PLD 370. Under the supervision of control circuitry 410, PLD configuration circuitry 405 uses configuration data (which it obtains from an external source, such as a storage device, a host, etc.) to program or configure the functionality of PLD 370. The configuration data determine the functionality of PLD 370 by programming programmable logic 375 and programmable interconnect 380, as persons skilled in the art with the benefit of the description of the invention understand.

I/O circuitry 395 may constitute a wide variety of I/O devices or circuits, as persons of ordinary skill in the art who have the benefit of the description of the invention understand. I/O circuitry 395 may couple to various parts of PLD 370, for example, programmable logic 375 and programmable interconnect 380. I/O circuitry 395 provides a mechanism and circuitry for various blocks within PLD 370 to communicate with external circuitry or devices.

PLD 370 may include one or more processors 385. Processor 385 may couple to other blocks and circuits within PLD 370. Processor 385 may receive data and information from circuits within or external to PLD 370 and process the information in a wide variety of ways, as persons skilled in the art with the benefit of the description of the invention appreciate. One or more of processor(s) 385 may constitute a digital signal processor (DSP). DSPs allow performing a wide variety of signal processing tasks, such as compression, decompression, audio processing, video processing, filtering, and the like, as desired.

PLD 370 may further include one or more memories 390 and one or more controller(s) 400. Memory 390 allows the storage of various data and information (such as user-data, intermediate results, calculation results, etc.) within PLD 370. Memory 390 may have a granular or block form, as desired. Controller 400 allows interfacing to, and controlling the operation and various functions of circuitry outside PLD 370. For example, controller 400 may constitute a memory controller that interfaces to and controls an external synchronous dynamic random access memory (SDRAM), as desired.

As noted above, PLD 370 may include test/debug circuitry, which facilitates the testing and troubleshooting of various blocks and circuits within PLD 370. The test/debug circuitry may include a variety of blocks or circuits known to persons of ordinary skill in the art who have the benefit of the description of the invention. For example, the test/debug circuitry may include circuits for performing tests after PLD 370 powers up or resets, as desired. The test/debug circuitry may also include coding and parity circuits, as desired.

PLD 370 may also include one or more communication circuits. The communication circuit(s) may facilitate data and information exchange between various circuits within PLD 370 and circuits external to PLD 370, as persons of ordinary skill in the art who have the benefit of the description of the invention understand. As an example, the communication circuit(s) may provide various protocol functionality (e.g., Transmission Control Protocol/Internet Protocol (TCP/IP), User Datagram Protocol (UDP) etc.), as desired. As another example, the communication circuit(s) may include network (e.g., Ethernet, token ring, etc.) or bus interface circuitry, as desired.

Clock distribution circuitry receives clock signal 328 from clock source circuitry 325 and, as noted above, distributes clock signal(s) 360 to various blocks and circuits within PLD 370. Clock source circuitry 325 may include one or more signal sources 320. Each of signal sources 320 may constitute a circuit arrangement as shown in FIGS. 1 and 3-7. More specifically, each signal source 320 may include a ring oscillator and associated tuning circuitry according to FIGS. 1 and 3-6. In addition, or instead, each signal source 320 may include a PLL, such as the PLL in FIG. 7.

PLD 370 may include clock divider circuitry 355, clock multiplier circuitry 335, or both, as desired. Clock divider circuitry 355 and clock multiplier circuitry 335 may include one or more signal sources 320. Similar to clock source circuitry 325 described above, each signal source 320 may include a circuit arrangement as shown in FIGS. 1 and 3-7.

Clock divider circuitry accepts clock signal 328 and divides its frequency by a desired number to provide divided clock signal 350. Conversely, clock multiplier circuitry 335 multiplies the frequency of clock signal 328 to provide multiplied clock signal 340. Clock distribution circuitry 345 accepts divided clock signal 350 and multiplied clock signal 340 and distributes them to various blocks or circuitry within PLD 370, as desired.

Note that, generally speaking, one may apply the inventive concepts described above in connection with FIG. 9 to a variety of general-purpose or special-purpose ICs, as desired. Note further that one may generally apply the inventive concepts effectively to various programmable logic circuitry or ICs known by other names in the art, as desired, and as persons skilled in the art with the benefit of the description of the invention understand. Such circuitry include devices known as complex programmable logic device (CPLD), programmable gate array (PGA), and field programmable gate array (FPGA).

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown.

For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. An integrated circuit (IC), comprising:
   a ring oscillator;
   a first tuning circuit coupled to the ring oscillator, the first tuning circuit configured to tune the ring oscillator by varying an amount of power supplied to the ring oscillator; and
   a second tuning circuit coupled to the ring oscillator, the second tuning circuit configured to tune the ring oscillator by varying a capacitance of a set of varactors.

2. The integrated circuit (IC) according to claim 1, wherein varying the amount of power supplied to the ring oscillator coarse-tunes an output frequency of the ring oscillator.

3. The integrated circuit (IC) according to claim 2, wherein varying a capacitance of a set of varactors fine-tunes the output frequency of the ring oscillator.

4. The integrated circuit (IC) according to claim 3, wherein a variable impedance device varies the amount of power supplied to the ring oscillator.

5. The integrated circuit (IC) according to claim 4, further comprising a digital-to-analog converter (DAC), the digital-to-analog converter configured to convert a set of digital control signals to an analog control signal supplied to variable impedance device.

6. The integrated circuit (IC) according to claim 5, wherein the variable impedance device comprises a metal oxide semiconductor field-effect transistor (MOSFET).

7. The integrated circuit (IC) according to claim 1, wherein the ring oscillator comprises a plurality of inverting stages coupled together in a ring structure.

8. The integrated circuit (IC) according to claim 7, wherein the set of varactors includes a plurality of varactors, each of the plurality of varactors coupled to a respective one of the inverting stages of the ring oscillator.

9. The integrated circuit (IC) according to claim 7, wherein the plurality of inverting stages comprise differential inverting stages.

10. The integrated circuit (IC) according to claim 7, wherein the plurality of inverting stages comprise single-ended inverting stages.

11. The integrated circuit (IC) according to claim 1, wherein varying a capacitance of a set of varactors fine-tunes the output frequency of the ring oscillator.

12. The integrated circuit (IC) according to claim 11, wherein varying the amount of power supplied to the ring oscillator fine-tunes an output frequency of the ring oscillator.

13. A circuit arrangement, comprising:
    a phase detector, the phase detector configured to provide an output signal by comparing a phase of an input signal with a phase of a time-varying signal derived from an output signal of a ring oscillator,
    wherein the ring oscillator is tuned by controlling a power supply of the ring oscillator in response to a first set of control signals, and
    wherein the ring oscillator is further tuned by varying a canacitarice of at least one varactor in response to a second control signal derived from the output signal of the phase detector.

14. The circuit arrangement according to claim 13, wherein controlling the power supply of the ring oscillator coarse-tunes an output frequency of the ring oscillator.

15. The circuit arrangement according to claim 14, wherein varying a capacitance of the least one varactor fine-tunes the output frequency of the ring oscillator.

16. The circuit arrangement according to claim 13, further comprising a first divider, the first divider configured to provide the input signal by dividing by R a frequency of a reference signal, wherein R comprises a positive integer number.

17. The circuit arrangement according to claim 16, further comprising a second divider, the second divider configured to provide the time-varying signal by dividing by L a frequency of the output signal of the ring oscillator, wherein L comprises a number.

18. The circuit arrangement according to claim 17, wherein L is larger than R.

19. The circuit arrangement according to claim 18, wherein L is smaller than R.

20. The circuit arrangement according to claim 17, wherein L equals R.

21. The circuit arrangement according to claim 13, further comprising a charge pump coupled to the phase detector, the charge pump configured to provide a charge pump output signal.

22. The circuit arrangement according to claim 21, further comprising a filter coupled to the charge pump, the filter configured to derive a filtered signal from the charge pump output signal.

23. The circuit arrangement according to claim 22, further comprising:
    a variable impedance device, the variable impedance device configured to control the power supply of the ring oscillator in response to a third control signal; and
    a digital-to-analog converter (DAC) coupled to the variable impedance device, the digital-to-analog converter (DAC) configured to derive the third control signal from the first set of control signals.

24. A method of generating a signal having a desired frequency, the method comprising:
    tuning an output frequency of a ring oscillator to a first frequency by controlling an amount of power applied to the ring oscillator; and
    further tuning the output frequency of the ring oscillator to the desired frequency by varying a capacitance of at least one varactor.

25. The method according to claim 24, further comprising coarse-tuning the output frequency of the ring oscillator by controlling the amount of power supplied to the ring oscillator.

26. The method according to claim 25, wherein the first frequency falls within a range of frequencies that includes the desired frequency.

27. The method according to claim 25, further comprising fine-tuning the output frequency of the ring oscillator to the desired frequency by varying a capacitance of at least one varactor.

28. The method according to claim 27, further comprising generating a first signal having a frequency that is greater than the output frequency of the ring oscillator.

29. The method according to claim 27, further comprising generating a second signal having a frequency that is less than the output frequency of the ring oscillator.

30. The method according to claim 24, further comprising coarse-tuning the output frequency of the ring oscillator to the desired frequency by varying a capacitance of at least one varactor.

31. The method according to claim 30, further comprising fine-tuning the output frequency of the ring oscillator by controlling the amount of power supplied to the ring oscillator.

32. A method of providing a set of clock signals in an integrated circuit (IC), the method comprising:
    coarse-tuning an output frequency of a ring oscillator to a frequency in a range of frequencies that includes a first clock frequency by controlling a source of power applied to the ring oscillator; and
    fine-tuning the output frequency of the ring oscillator to the first clock frequency by varying a capacitance of at least one varactor.

33. The method according to claim 32, further comprising generating a second clock signal, the second clock signal having a frequency that is larger than the first clock frequency.

34. The method according to claim 33, further comprising generating a third clock signal, the third clock signal having a frequency smaller than the first clock frequency.

35. The method according to claim 34, further comprising distributing the second clock signal within the integrated circuit (IC).

36. The method according to claim 35, further comprising distributing the third clock signal within the integrated circuit (IC).

37. The method according to claim 33, wherein the second clock signal is generated by using a phase-locked loop (PLL).

38. The method according to claim 34, wherein the second clock signal is generated by using a phase-locked loop (PLL).

* * * * *